United States Patent

Dobson et al.

[11] Patent Number: 5,906,670
[45] Date of Patent: May 25, 1999

[54] MAKING PARTICLES OF UNIFORM SIZE

[75] Inventors: Peter James Dobson, Oxford; Oleg Viktorovich Salata, Woodstock; Peter James Hull, Kuntsford; John Laird Hutchison, Oxford, all of United Kingdom

[73] Assignee: Isis Innovation Limited, United Kingdom

[21] Appl. No.: 08/648,025

[22] PCT Filed: Nov. 15, 1994

[86] PCT No.: PCT/GB94/02514

§ 371 Date: Jun. 18, 1996

§ 102(e) Date: Jun. 18, 1996

[87] PCT Pub. No.: WO95/13891

PCT Pub. Date: May 26, 1995

[30] Foreign Application Priority Data

Nov. 15, 1993 [GB] United Kingdom ............ 9323498

[51] Int. Cl.⁶ ........................................ B22F 9/26
[52] U.S. Cl. .......................... 75/370; 75/343; 257/17
[58] Field of Search ................. 75/343, 370; 257/17

[56] References Cited

U.S. PATENT DOCUMENTS 4,331,707  5/1982  Muruska et al. ............... 427/74
5,260,957  11/1993  Hakimi et al. ................. 372/39

OTHER PUBLICATIONS (Abstract) Proc. Spie—Int. Soc. Opt. Eng. 1758, 1992.

*Primary Examiner*—Patrick Ryan
*Assistant Examiner*—M. Alexandra Elve
*Attorney, Agent, or Firm*—Nixon & Vanderhye P.C.

[57] ABSTRACT

Quantum dots of a metal or metal compound are made by a method of providing a solution in an evaporable solvent at a predetermined concentration of a chosen metal and forming droplets of the solution of a substantially uniform predetermined size. The droplets are thereafter brought into contact with a gas phase reagent thereby forming the metal or metal compound quantum dots desired. The solvent may be removed before, during or after the contacting of the droplets with the gas phase reagent. The metal or metal compound quantum dots so formed are deposited on a substrate. The quantum dots may be contained within a polymer as a film. By control of the concentration of the solution and the size of the droplets the size of the quantum dots may be closely controlled.

20 Claims, 2 Drawing Sheets

MAKING PARTICLES OF UNIFORM SIZE

FIELD OF INVENTION

This invention relates to a method of making particles of uniform size. These are preferably semiconductor particle of nanometer dimensions, known generally as quantum sized particles, or more particularly as zero dimensional crystallites or quantum dots.

BACKGROUND AND SUMMARY OF THE INVENTION

Quantum dots are defined as small particles whose linear dimension in all three directions is less than the de Broglie wavelength of the electrons or holes. Such particles have a greatly modified electronic structure from the corresponding bulk semiconductor material and, in particular, the density of states becomes more like that for molecules. The applications for quantum dots are generally in the field of optoelectronics, and includes such things as light switches and light emitters. A paper describing quantum dots and some of their properties has been published in Angewandte Chemie International Edition (English) 1993, 32, at pages 41–53: "semiconductor q-particles: chemistry in the transition region between solid state and molecules" by Horst Weller.

For the successful exploitation of quantum dots, it is important that all or most of the particles are of the same physical size and shape. With improved consistency of particle size and shape the materials made from such particles have well defined excitonic features which in turn improves the responsiveness and efficiency of optoelectronic devices utilising such materials. A number of methods of achieving this has been tried and most are centred on the production of colloids or inverse micelles or on "smokes". Size control or size selection remains a problem and is the subject of a great deal of research effort. This invention offers a new approach to this problem which may be capable of giving up to about an order of magnitude better size control.

In one aspect, the invention provides a method of making particles of substantially uniform size of a metal or metal compound, which method comprises providing a solution in an evaporable solvent of the metal in chemically combined form, forming the solution into droplets of substantially uniform size, contacting the droplets with a gas-phase reagent so as to form the metal or metal compound, and removing the evaporable solvent from the droplets.

Figure 1:
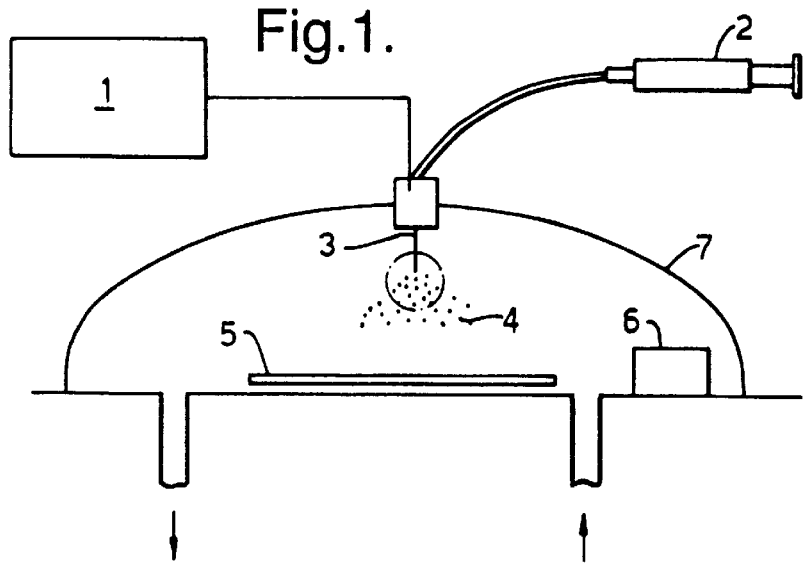
FIG. 1 is schematic diagram of a spray nozzle assembly which may be used in accordance with the present invention to generate the desired droplet size.
Figure 1A:
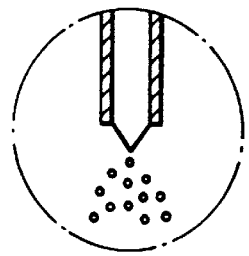
FIG. 1a is detailed cross-sectional view of the capillary nozzle member employed in the assembly depicted in FIG. 1.
Figure 4:
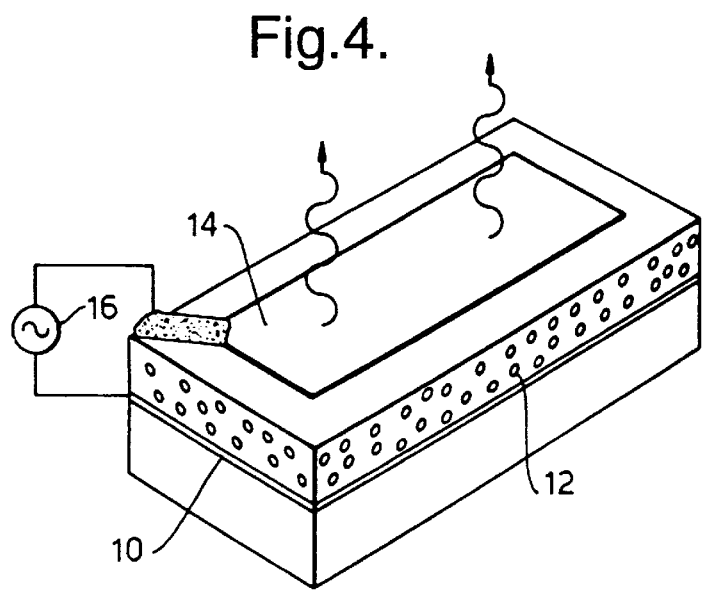
FIG. 4 is a diagrammatic perspective view of a quantum dot light emitter.
Figure 5:
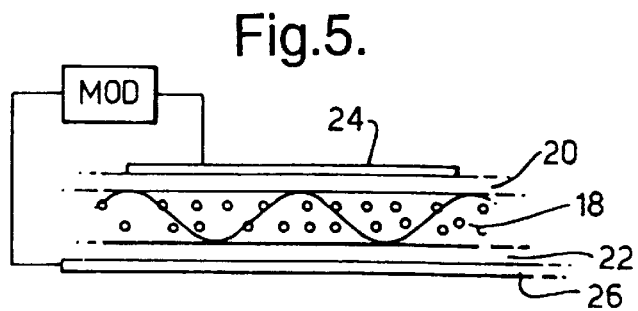
FIG. 5 is a cross-section of a quantum dot electro-optic modulator incorporating wave guide geometry.

The method starts with a solution in an evaporable solvent of the chosen metal in chemically combined form. The evaporable solvent is volatile in the sense that the solvent is evaporable under the reaction conditions used and may be water or an organic solvent whose nature is not important. Although other chemically combined forms are possible, the metal is typically present in the form of a salt, preferably a salt with a volatile anion such as nitrate, chloride, fluoride or acetate.

A wide variety of metals may be used, most usually transition metals and metals from Groups II, III, and IV of the Periodic Table. Thus Group II metals such as zinc or cadmium can be used with hydrogen sulphide or hydrogen selenide to make II–VI semiconductors. Mixtures of metals from Groups II and IV, such as Cd/Hg or Pb/Sn, can be used again for example with hydrogen sulphide or hydrogen selenide to make II–IV–VI semiconductors. Also, group III metals such as aluminium, gallium or indium can be used to make III–V semiconductors. Other compounds which may be made using this method are, for example IV–VI compounds such as PbS, II–VII$_2$ compounds such as CaI$_2$, II$_x$–V$_2$ compounds such as Cd$_3$As$_2$, II–V compounds such as ZnSb, II–V$_2$ compounds such as CdP$_2$, III$_x$–VI$_y$ compounds such as GaSe, III–VII compounds such as TlBr, IV$_x$–V$_y$ compounds such as SiAs, IV–VI$_2$ compounds such as SnO$_2$ etc.

The solution may contain polyphosphate as stabiliser, for example in the form of sodium polyphosphate which has an average chain length of about 15 PO$^-_3$ units. Polyphosphate is well suited for the stabilisation of nanometer size particles, because the chain is strongly bound by metal ions on to the particle surface. It causes electrostatic repulsion between particles because of its charge, and also keeps them apart sterically because of its chain length. Other frequently used stabilisers are thiols. Alteratively, the starting solution may contain an organic polymer which encapsulates the metal or metal compound particle. Many organic polymers, in solution or dispersion in the volatile liquid, are suitable and known to those working in the field. Examples of suitable polymers include polyvinyl alcohol, polyvinyl acetate, polymethyl methacrylate and polycarbonate. With each of the above examples of stabilisers, particle aggregation whilst in solution is prevented. Subsequently though the polyphosphate or organic polymer binds the dried particles into a film.

The solution is converted into droplets, and it is a critical feature of the invention that the size of these droplets be made as nearly uniform as possible. Suitable for this purpose is an electrostatic spray nozzle, in which a jet of aerosol droplets can be formed by the electrostatic deformation of a meniscus of the starting solution. The droplet size can be controlled by varying the flow rate from a reservoir and the voltage applied to the nozzle. Other ways of making uniform droplets may be employed.

The droplets are brought into contact with a gas-phase reagent preferably under low-pressure conditions such that the reagent converts the chemically combined metal in the droplets to the desired metal compound. In this respect each droplet may be viewed as an independent reaction volume. Preferred reagents are hydrides of elements from groups V and VI in the Periodic Table, e.g. H$_2$S, H$_2$Se, H$_2$Te and PH$_3$, AsH$_3$ and SbH$_3$. These reagents react with the chemically combined metal present in solution in each droplet, with the formation of an insoluble sulphide, selenide, telluride, phosphide, arsenide or antimonide. Oxygen or other oxidising gas such as carbon dioxide is also suitable for forming a metal oxide compound. Hydrogen or other reducing gas may be used as the reagent for forming particles of elemental metal. The concentration of the gas-phase reagent, and the time and temperature required to convert a dissolved metal salt to an insoluble metal or metal compound, are readily determined by trial and error.

Finally, the volatile solvent is evaporated off to leave the desired particles of metal or metal compound. Where the starting solution contained a polymer, the particles are encapsulated in the polymer. Evaporation of solvent may take place before and/or during and/or after reaction with the gas-phase reagent.

The size of the resulting particles or quantum dots depends on two factors: the concentration of the chemically combined metal in the starting solution; and the size of the formed droplets. Both these variables are readily controlled and predetermined either experimentally or theoretically to provide particles or quantum dots of desired size, which is typically less than 25 nm, and preferably in the range 1 to 20 nm. Electro-optic effects may be more pronounced at the top end of this range of sizes, while non-linear optic effects may be more pronounced at the lower end.

In order to have some idea of concentrations of ions etc. let us examine the case where we wish to make spherical particles of CdS with a diameter of 3 nm. From the density of CdS or from its lattice spacing we can estimate that a 3 nm particle will contain 286 Cd atoms. Now, if we make an aerosol particle of 1 $\mu$m diameter it should contain 286 Cd ions. The volume of the aerosol particle is $5.23 \times 10^{-9}$ m$^3$, hence we can estimate the concentration of cadmium salt which is needed in the stock solution. This works out at $2.128 \times 10^{-5}$ g per 100 ml for a solvent such as chlorobenzene or acetonitrile. Note that this is small, but will permit a high degree of precision. With regards to the polymer, we will adjust the concentration to give a final required (polymer & CdS) aerosol size. A 5% solution will give particles of 0.377 $\mu$m whereas a 0.1% solution will give 0.1 $\mu$m particles. These figures are for volume % mixtures and apply for a wide range of the usual polymers.

An example of a spray nozzle assembly which may be used to generate the desired droplet size is shown in FIG. 1. The assembly consists of a reaction chamber 7 which is an evacuable chamber having inlet and outlet ports for the introduction and circulation, if desired, of a gas, e.g. nitrogen. A capillary nozzle member 3 projects into an upper region of the reaction chamber 7 and is connected to a reservoir 2 of the solution to be issued as an aerosol. The capillary nozzle member 2 is also connected to a voltage supply 1 for raising the voltage potential of the nozzle member so that it is positive with respect to a substrate 5 located along the base of the reaction chamber 7. The reaction chamber 7 also contains an open vessel 6 in which the gas-phase reagent is produced.

When in use, the positive potential is applied to the nozzle member 3 and the solution delivered from the reservoir 2 to the nozzle member 3 at a minimum permissible pressure. The aerosol droplets 4 formed fall from the nozzle member 3 under the effect of gravity and the applied voltage potential to the substrate 5 beneath.

The nozzle member 3 may be a conventional capillary tube or alternative devices may be used which enable the desired physical containment of the solution to a narrow path, for example focussing electrodes.

The assembly may be used to coat a static substrate or alternatively could be used in a continuous process for the coating of a moving linear substrate such as a tape. In these circumstances the rate of movement of the tape must be matched to the arrival rate of the particles. The assembly can also be used to "write" a structure with the particles, such as a wave guide. Since the droplets are highly charged, they can be focussed and deflected in any conventional manner to control the deposition site of the particles on the substrate.

In an appropriately configured assembly a single layer of quantum dots may be deposited on the substrate.

Where the aerosol droplet production is done under reduced pressure, the resulting particles will have some forward momentum, and are deposited on the substrate placed under the nozzle. The particles also can be dispersed into a liquid carrier, e.g. a solution of the aforementioned polymers, which may then be coated onto a substrate, e.g. by spin coating and dried.

In another aspect, the present invention provides optoelectronic devices incorporating quantum dots made by the method described herein. Reference to optoelectronic devices is to devices which may emit light when electrically stimulated or which may modulate the refraction of light passing through them in response to electrical stimulation. The quantum dots which produce or modulate the light are preferably incorporated in the devices in a polymer film layer as mentioned above, with suitable electrodes applied thereto by conventional methods.

The following examples illustrates the invention.

EXAMPLE 1

A starting solution was prepared consisting of $10^{-3}$ M cadmium nitrate in water, the solution also containing 1M sodium hexametaphosphate. This solution was diluted 1000 times with ethanol. This solution was presented to the electrostatic spray nozzle assembly shown in FIG. 1, operated at 1–10 keV, so as to generate aerosol droplets of diameter 0.1 to 10 $\mu$m. Conditions were chosen which produced aerosol droplets in the 0.1–1 $\mu$m range in a gas phase comprising a 5% hydrogen sulphide in nitrogen at a pressure of $7.60 \times 10^4$ Nm$^{-2}$ in an evacuated vessel at a temperature of 300 K for the following chemical reaction to take place:

$$Cd(NO)_3 + H_2S \_ CdS + 2HNO_3$$

(in droplet)(from atmosphere) (in droplet) (to atmosphere)

The ethanol/water evaporated off to give particles of CdS having a mean diameter of about 6 nm. The hexametaphosphate formed an inorganic polymer which encapsulated the particles and formed a polyphosphate film containing the particles on the surface toward which the spray was directed.

Figure 2:
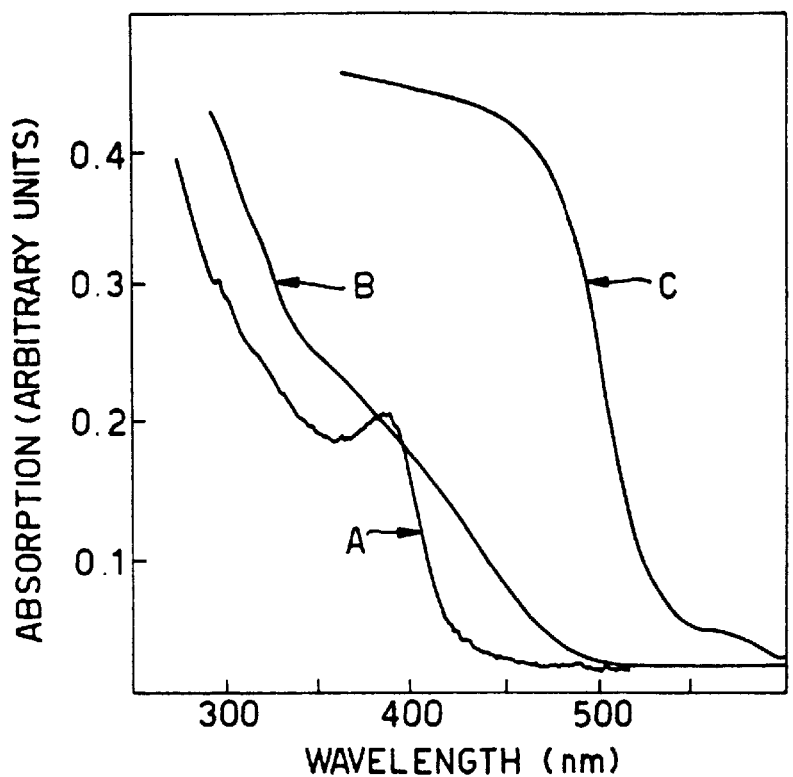
FIG. 2 shows an absorption spectrum of material made by the present invention (Line A) compared to absorption spectra of material made by a previously known colloid method (Line B) and macrocrystalline cadmium sulfide of approximately 515 nm (Line C)
Figure 3:
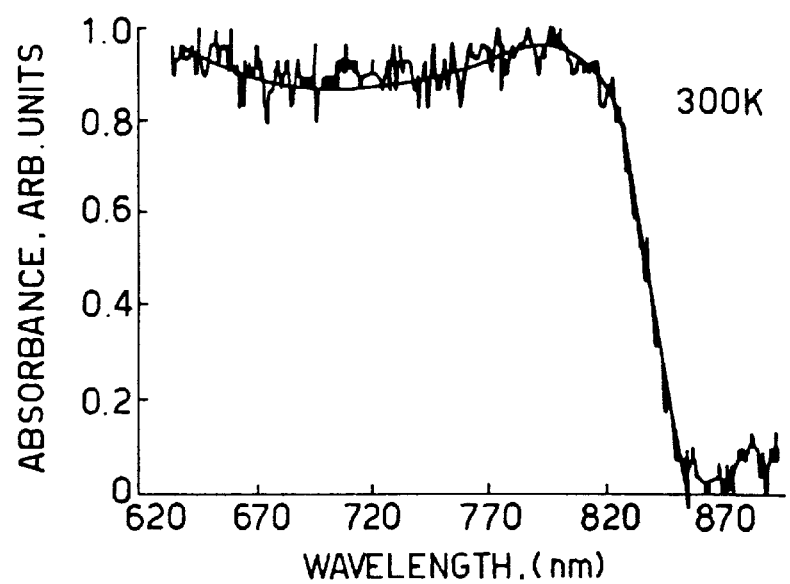
FIG. 3 is an absorption spectrum of material made in accordance with Example 2 below.

Reference is directed to FIG. 2 of the accompanying drawings in which line A is an absorption spectrum of material made by the method described above. The absorption edge for macrocrystalline cadmium sulphide is approximately 515 nm (line C). The absorption edge of the small particles produced by the above method though has been shifted to about 415 nm. Line B is a typical spectrum of quantum dots produced by a previously known colloid method. As can be clearly seen the absorption edge is much less sharp.

The inventors have repeated this experiment, using polyvinyl alcohol instead of sodium hexametaphosphate, with similar results.

EXAMPLE 2

5 g of low molecular weight polyvinyl alcohol were dissolved in 100 mL of distilled water. 5 $\mu$L of the solution and 20 $\mu$L of 1 M Ga(NO$_3$)$_3$ in water were added to 10 mL of methanol. The spray nozzle assembly was operated at 7 keV positive potential at the capillary with a 30 mm gap between the tip of the nozzle and the substrate. The liquid was presented to the nozzle at the minimum possible applied pressure at 300 K. The reaction chamber contained a nitrogen atmosphere in which arsenic was supplied, in situ, by reacting sodium arsenide with zinc nitrate and dilute sulphuric acid to form arsine gas. Ions of Ga in the aerosol droplets reacted with the arsenic from the gas phase producing GaAs nanoparticles encapsulated in polyvinyl alcohol (PVA). The GaAs/polymer particles were driven by the applied electric field toward the substrate and deposited onto an aluminium film. Accompanying FIG. 3 shows experimental data for the absorption spectrum of the material made by the method of this Example 2, with a sharp absorption edge at about 840 nm.

Reference is directed to FIG. 4 of the accompanying drawings, which is a diagrammatic perspective view of a quantum dot light emitter. The device comprises an underlying metal layer 10, a layer 12 about 1 μm thick of polymer filled with quantum dots, and an overlying transparent ITO (indium/tin oxide) layer 14 through which the emitted light can pass, as indicated by upward arrows. The layers 10 and 14 may be reversed, the requirement being that at least one of the contact layers is optically transparent. The thickness of the quantum dot/polymer layer may range from 10 nm to 10 μm. The device acts as a lossy capacitor structure and is pumped with high frequency a.c. from a source 16. The applied voltage is preferably in the range 3 to 20 volts peak to peak and has a frequency in the range of a few kHz to a few MHz. Alternatively, with the appropriate contact materials, direct current excitation may be used. The lossy capacitor structure when operated at high frequency obviates the need for direct electrical contact into the quantum dots i.e. energy to excite the electron-hole pairs is fed into the quantum dots via the displacement current. Guided mode and distributed feedback structures are also envisaged. The wavelength of the emitted light can be altered by changing the particle size.

Turning now to FIG. 5 of the accompanying drawings, a cross-section of a quantum dot electro-optic modulator incorporating wave guide geometry is shown. The device comprises five overlying layers each about 1 μm thick. A layer 18 comprising polymer and quantum dots is sandwiched between polymer layers 20 and 22, which in turn are sandwiched between electrically conducting layers 24 and 26. The quantum dot/polymer layer is deposited onto a layer of polymer having lower refractive index than the quantum dot/polymer composite. As mentioned above, the latter is deposited to a thickness of 1 μm or thicker, and is covered with another low refractive index polymer layer. The polymer layers can be deposited by any appropriate technique e.g. spin coating, dip coating, vapour deposition etc. This waveguide structure can be used as a section of any optoelectronic circuit, a potential applied across the electrodes serves to modulate the effective refractive index of the guiding quantum dot/polymer layer. Typically, voltages of around 10 volts across two or three microns of combined layer thickness are necessary. In this way a varying electrical signal can be converted into a varying optical signal.

Guided mode structures such as the one shown in FIG. 5 are made such that the quantum dot containing layer is surrounded by a polymer layer having a lower real part of refractive index, thus permitting guided modes to propagate along the quantum dot/polymer layer. This layer could be designed to operate in a single or multi-mode manner by appropriate adjustment of the refractive indices of the cladding and quantum dot/polymer layers after deposition.

The above structures all perform better when made by the method of the present invention because the narrow size distribution of the particles results in a sharp onset of the optical absorption edge and well defined excitonic features which can be exploited in a wide range of optoelectronic applications.

Surface active molecules can be added to suppress the effect of dangling bonds at the surface of the quantum dot/polymer. This can result in a 50 fold improvement of luminescence and has no effect on the other functions.

We claim:

1. A method of making quantum dot particles of substantially uniform size of a metal or metal compound, which method comprises providing a solution in an evaporable solvent at a predetermined dilution of the metal in chemically combined form, forming the solution into droplets of substantially uniform predetermined size, contacting and reacting the droplets with a gas-phase reagent as the droplets move through the gas-phase reagent thereby forming the metal or metal compound, removing the evaporable solvent from the droplets whereby each droplet forms a respective quantum dot particle of the metal or metal compound and collecting the quantum dot particles on a substrate.

2. A method as claimed in claim 1, wherein the solution is a metal salt in which the metal is selected from Zn, Cd, Pb, Sn, Hg, Al, Ga, In, Ti, Si and Ca.

3. A method as claimed in claim 1, wherein the gas phase reagent is selected from $H_2S$, $H_2Se$, $H_2Te$, $PH_3$, $AsH_3$ and $SbH_3$.

4. A method as claimed in claim 1, wherein the metal is Ag, In, Fe or Ni.

5. A method as claimed in claim 1, wherein the metal compound is a semiconductor.

6. A method as claimed in claim 5, wherein the metal compound is CdS, GaAs, InAs, InN, or PbS.

7. A method as claimed in claim 1, wherein a polymer is provided in the solution.

8. A method as claimed in claim 1, wherein the solution is passed through a device which confines the passage of the solution to a narrow path before emerging in droplet form in a chamber, the device being at a positive potential with respect to the chamber.

9. A method as claimed in claim 8, wherein the solution is passed through an electrostatic capillary nozzle.

10. A method as claimed in claim 8, wherein the solution is supplied to the device at a minimum possible pressure.

11. A method as claimed in claim 8, wherein the gas phase reagent is contained within the chamber.

12. A method as claimed in claim 1, wherein the metal or metal compound particles formed are deposited on a substrate.

13. A method as claimed in claim 1, wherein the solution is passed through a device which confines the passage of the solution to a narrow path before emerging in droplet form in a chamber, the device being at a positive potential with respect to the chamber and the chamber contains a substrate on which the metal or metal compound particles formed are deposited.

14. A method as claimed in claim 13, wherein an electric field is applied across the region in which the droplets are contacted with the gas phase reagent thereby controlling the deposition of the metal or metal compound particles on the substrate.

15. A method as claimed in claim 13, wherein the substrate is a moving continuous strip, the rate of movement of the strip being matched to the rate of deposition of the metal or metal compound particles.

16. A method of making nanometric particles of substantially uniform size of a metal or metal compound, which method comprises providing a solution in an evaporable solvent at a predetermined dilution of the metal in chemically combined form, forming the solution into droplets of substantially uniform predetermined size, contacting and reacting the droplets with a gas-phase reagent as the droplets move through the gas-phase reagent thereby forming the metal or metal compound, and removing the evaporable solvent from the droplets whereby each droplet forms a respective nanometric particle of the metal or metal compound.

17. An optoelectronic device incorporating quantum dots made by the method of claim 1 or claim 16.

18. An optoelectronic device as claimed in claim 17 in the form of a lossy capacitor having first and second contact layers either side of a layer including quantum dots, said contact layers being connected to an external power supply.

19. An optoelectronic device as claimed in claim 17 in the form of a waveguide having first and second polymer layers which have a lower refractive index than a central layer of a polymer containing quantum dots, the waveguide being arranged to receive incident light on an exposed surface of the central layer.

20. An optoelectronic device as claimed in claim 17 in the form of a distributed feedback device having a central quantum dot/polymer layer, polymer layers either side of the quantum dot/polymer layer having a lower refractive index than the quantum dot/polymer layer and contact layers on the outside of the polymer layers, the contact layers being connected to an external power supply.

* * * * *